United States Patent [19]

Hoyer-Ellefsen

[11] 4,384,633
[45] May 24, 1983

[54] PERFORATED ACOUSTIC TRANSPORT MEMBER

[75] Inventor: Sigurd Hoyer-Ellefsen, New Canaan, Conn.

[73] Assignee: SCM Corporation, New York, N.Y.

[21] Appl. No.: 246,819

[22] Filed: Mar. 23, 1981

[51] Int. Cl.³ .............................................. B41J 5/08
[52] U.S. Cl. .............................. 181/142; 178/17 C; 310/334; 400/477
[58] Field of Search .................. 340/365 R, 365 S; 84/1.7, 438, 404, 402; 178/17 C, 30; 367/191; 310/328, 334; 116/169; 181/142

[56] References Cited

U.S. PATENT DOCUMENTS

| | | | |
|---|---|---|---|
| 81,874 | 4/1906 | Deagan | 84/402 X |
| 3,229,021 | 1/1966 | Baschet | 84/404 X |
| 3,644,656 | 2/1972 | Fender et al. | 84/404 X |

*Primary Examiner*—S. C. Buczinski
*Assistant Examiner*—K. R. Kaiser
*Attorney, Agent, or Firm*—William E. Mear, III; Ernest F. Weinberger

[57] ABSTRACT

An improved acoustic transport member for use in a keyboard having key operated strikers individually actuatable for inducing acoustic energy in the form of sound waves which propagate through the member from selected inducing positions therealong. A first portion of the member is fabricated in the form of a series of tabs to provide discrete impact positions for generating sound waves in response to impact actuation of related strikers. A second portion integrally connected with the first portion links all of the tabs and functions as a sound corridor for receiving and transporting all sound waves generated as a result of the selected striker impacting its related tab. An aperture is provided through the tabs. A peripheral rim of the aperture provides sound reflecting boundaries that define sound passages on the tabs for directing the sound waves in different directions in communicating the sound waves from the tabs into the corridor. As a result of the sound waves passing through the passages, distinct wave separation is accomplished. A top portion of the peripheral rim is located along the base of the corridor for reflecting the traveling waves in a manner substantially preventing the waves from entering into areas of passing tabs, thus confining the propagating sound waves within the corridor portion of the member. By controlling the sound waves through the passages and substantially trapping the propagating sound waves within the corridor, dispersion of the sound waves is effectively minimized.

4 Claims, 6 Drawing Figures

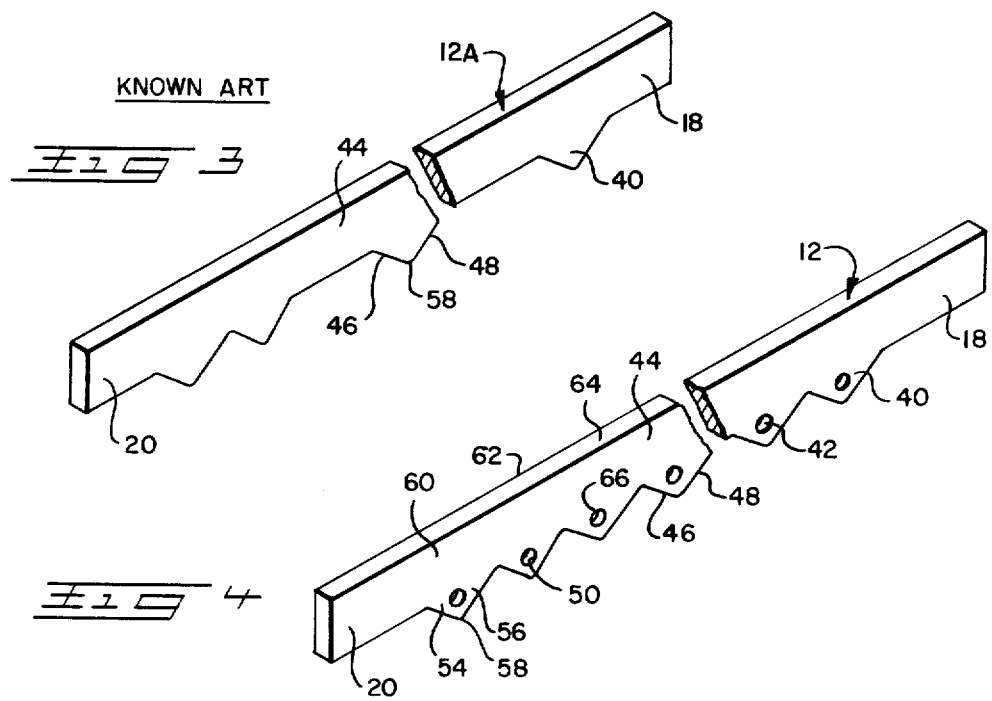
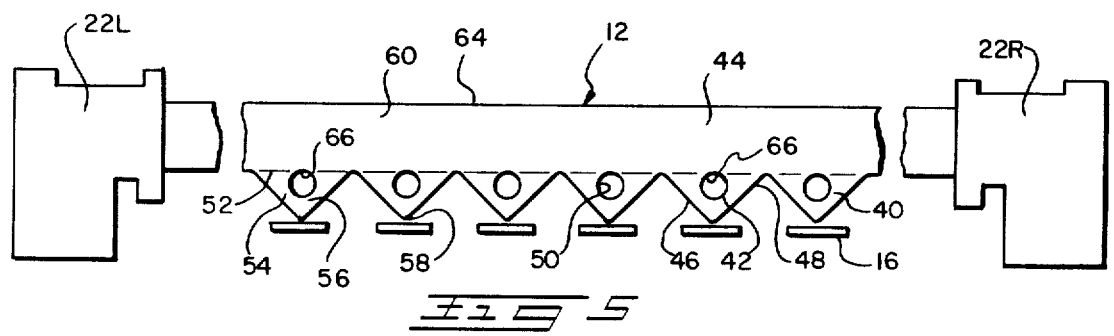
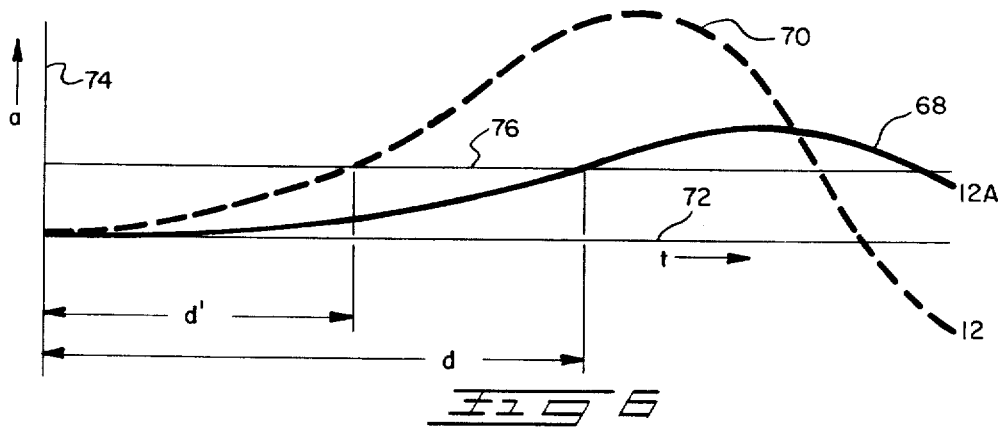

PERFORATED ACOUSTIC TRANSPORT MEMBER

BACKGROUND OF THE INVENTION

1. Field of the Invention

The present invention relates to improvements in acoustic transport members used for transmitting sound waves utilized in an acoustic keyboard system to provide information representative of a key selected. More particularly, this invention relates to improvements in the acoustic transport member over the construction disclosed in U.S. applications identified by: Ser. No. 087,854 entitled "Acoustic Encoding Apparatus", filed Oct. 24, 1979 which is a continuation of application Ser. No. 853,778 filed Nov. 21, 1977 now abandoned; Ser. No. 892,814 entitled "Multi-Bar Encoding Apparatus Utilizing Acoustic Energy", filed Apr. 3, 1978, now U.S. Pat. No. 4,258,356 both invented by Vincent P. Jalbert, and particularly a copending application Ser. No. 246,820 invented by Raymond A. Pajer et al entitled "Encoding Apparatus Utilizing Acoustic Waves of Controlled Polarity", filed on even date herewith. The three above mentioned applications have the same assignee as the present application. To the extent appropriate to the present invention, the disclosures of the above-identified U.S. applications are incorporated herein by reference.

2. Description of the Prior Art

Keyboards of the acoustic type have been demonstrated to be a successful advancement in the art, especially those keyboards used in conjunction with an encoding apparatus. Generally, acoustic keyboards employ sound inducing key means that operate to launch sound waves within an acoustic transport member assembled in the acoustic keyboard. These sound waves provide information e.g., elapsed time measured by circuitry and used to produce a discrete coded representation of the selected key. Examples of acoustic systems having keyboard input are fully outlined in the above-mentioned U.S. Pat. No. 4,258,356, applications U.S. Ser. No. 087,854, and simultaneously filed copending application of Raymond A. Pajer et al, (hereinafter referred to as prior U.S. applications I, II and III, respectively). Another example of an acoustic system using a member for transporting sound waves is disclosed in United Kingdom Pat. No. 1,386,070, granted to Roger Bennison, published Mar. 5, 1975 and entitled "Pressure Actuated Signalling Means". These acoustic systems all employ a form of an acoustic member capable of transporting sound waves. Yet, in the art there is a continued search to improve the reliability of these acoustic systems, particularly in the development of an acoustic member fabricated to retain the quality (intensity) of the sound wave signals over the distance traveled within the acoustic member as pointed out below.

In prior copending application I and the British Patent of Roger Bennison, the acoustic transport member disclosed is an elongated continuous cylindrical rod. The disclosed straight rod successfully transports sound waves, however lacks structure defining discrete impact points from which sound waves are emitted in response to key actuation. A well-defined impact point is necessary for ensuing encoding circuitry to accurately determine the key position selected along the rod. Accordingly, these two acoustic systems are sensitive to the lateral positioning of the sound inducing keys along the member. It has been found that sideways displacement of the sound inducing device with respect to the rod changes the intended impact location along the member and thereby introduces an acoustical variable in the system.

In prior application II, there is disclosed a different acoustic system based on sensing sound waves transmitted through a plurality of acoustic transport members. The acoustic principle disclosed in this system improves on the accuracy and reliability of known acoustic systems, however it is more complex and costly to implement. The acoustic members in prior application II are structured to include distinct impact points in the form of tabs pre-positioned along the member. Each acoustic member is generally a bar supporting the tabs in a longitudinal relationship according to the spacing of sound inducing strikers. These tabs provide the necessary structure on the member to afford lateral stability with respect to the strikers contacting the bar at precisely the same location along the bar with each actuation.

While the acoustic member with tabs (prior application II) is a considerable improvement over the previously straight rod members, in terms of laterally fixing the impact points in relationship with one another along the member, the multiple tabbed bars have been found to produce sound wave signals lacking in intensity compared to those generated within the straight rod over the same distance.

Copending application III discloses an acoustic transport member fabricated with specially-shaped teeth or dissimilar tabs that generate sound waves having a particular polarity combination different among adjacent impact points (tabs). As a result, the disclosed acoustic system is afforded a set of signals from a single acoustic member that are readily and accurately distinguishable for proper functioning by encoding devices even in the presence of acoustic variables effecting the quality of the sound waves when received by sound wave sensing and converting transducers coupled on the member.

In using the toothed member of copending application III, it was discovered that sound waves originating from near one end of the member produced a set of sound waves that when received by their respective transducer were significantly different in intensity levels based on the distance each is required to travel. In other words, the wave traveling the shorter distance is much higher in intensity than the wave forced to travel to the far end of the member. The reason for dissimilar intensity levels is attributed to dispersion or a scattering of the wave form in passage (lengthwise) through the member. Dispersion is believed to be primarily caused by the propagating waves entering enlarged areas represented by the tabs and being reflected off discontinuously orientated surfaces presented by the tab ends with respect to the intended direction of wave movement towards the transducers. Though the acoustic system repeatedly functioned properly with dissimilar wave intensities when tested in a laboratory environment, it is felt that this condition could cause marginal operation of the encoding device over a period of time and in consideration of high volume production. Accordingly, there is a need for improving the toothed acoustic transport member in an effort to equalize sound wave intensity sensed at each end of the member for safety sake.

SUMMARY OF THE INVENTION

The present invention substantially overcomes the above-mentioned dissimilar intensity problem by providing a keyboard having an acoustic transport member fabricated in a manner whereby the sound waves are directed towards ends of the member and dispersion of propagating sound waves is minimized. To attain this, a first portion on the member comprises a plurality of tabs for generating sound waves within the member. A second portion of the member is integrally formed with the first portion and functions as a sound corridor for transporting sound waves through the member. An aperture is provided through each tab which is constructed in the form of an equilateral triangle having the base of the triangle positioned where the tab joins the corridor. Preferably, the aperture is a circular hole centrally located on the triangle tangent with the base of the triangular shape. As a result of the circular aperture, a pair of solid sound passageways are defined on the tab between angular side edges of the tab and the peripheral edge of the aperture. Additionally, the top portion of the aperture's peripheral edge is positioned along the corridor for reflecting propagating sound waves to substantially isolate the traveling sound wave from contact with angular edges of the tabs as they pass thereby minimizing wave dispersion.

In the acoustic keyboard, a series of strikers are individually actuable from related selectable key means. Each striker is located opposite a related tab and when actuated, the selected striker impacts the tab giving rise to sound waves within the member. The induced sound waves emanate from the tip of the tab and are forced to pass through the passageways which effectively directs or aims the waves towards ends of the member when entering the sound corridor. Once inside the sound corridor, the sound waves propagate in diverging directions toward opposite ends of the member.

Surfaces of the member act as sound wave reflecting boundaries that confine the waves within the member. The surfaces of the second or corridor portion are continuous to extend horizontally along the member. Angular edges of the tabs are discontinuously orientated with respect to the continuous corridor surfaces. The top portion of the peripheral edge formed by the aperture reflects sound waves propagating through the corridor and substantially prevent the moving waves from coming into contact with the angular edges they are passing. As a result of substantially isolating the waves from contact with discontinuous angular tab surfaces, dispersion of the waves is minimized.

Accordingly, the propagating sound waves transported through the perforated acoustic transport member come in contact with a minimum number of discontinuously orientated surfaces and thus suffer the least amount of distortion. The amplitude of the sound waves traveling through the corridor remains at a substantially constant and predictable level that diminishes at only a slight rate primarily determined by the distance traveled.

Successful operation of acoustic keyboard systems, such as those described in aforementioned prior copending applications are vitally dependent upon receipt of well-defined quality sound waves. The present perforated acoustic transport member, in directing the sound waves in their communication between the tabs and the corridor and once inside the corridor by minimizing wave dispersion, repeatably and consistantly present sound waves of high amplitude.

Generally stated, it is an object of the present invention to provide an improved member for transport of sound waves in an acoustic system.

Another object of the present invention is to increase the operable reliability of the acoustic transport member used in acoustic keyboards, such as disclosed in prior U.S. applications I, II and III.

More specifically, it is an object of the present invention to provide an acoustic transport member that enables the transport of sound waves through the member with minimized wave dispersion.

Other objects and many of the attendant advantages of this invention will be readily appreciated as the same becomes better understood by reference to the following detailed description when considered in connection with the accompanying drawing.

DESCRIPTION OF THE DRAWING

FIG. 3 is a perspective view of a known acoustic transport member according to application II.

FIG. 4 is a perspective view of the present acoustic transport member removed from the keyboard.

FIG. 5 is a plan view of the present acoustic transport member in FIG. 4.

FIG. 6 is a graph showing amplitude as a function of time for comparing a wave form produced by the known acoustic transport member according to FIG. 3 and the present acoustic transport member according to FIG. 4.

DESCRIPTION OF THE PREFERRED EMBODIMENT

Figure 1:
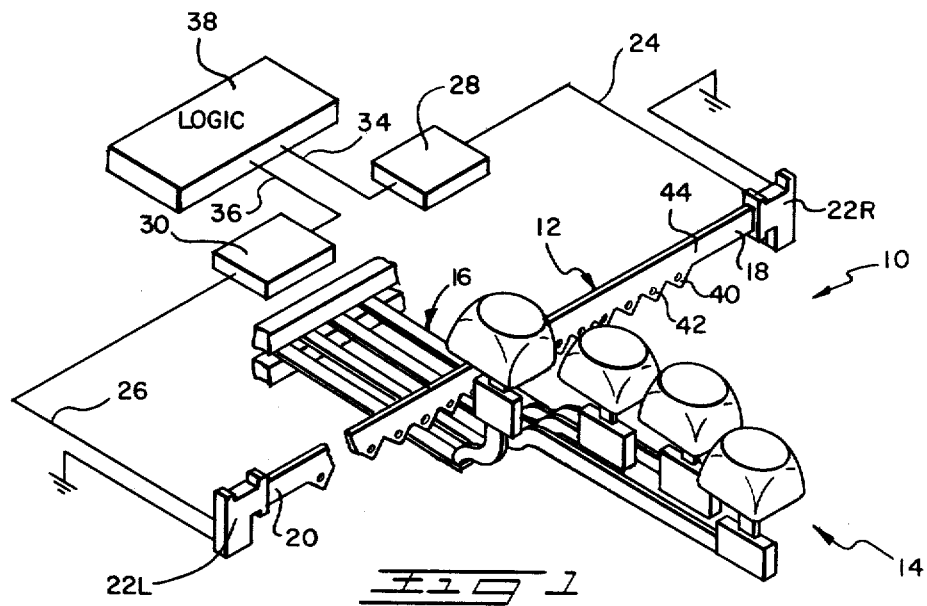
FIG. 1 is a perspective view showing an acoustic transport member according to the invention assembled in an acoustic keyboard of the type disclosed in prior copending application I.

In the illustration of FIG. 1 there are shown the basic operating components contained in a keyboard 10 of the acoustic type. An acoustic transport member 12 fabricated according to a preferred embodiment of the invention is fixedly positioned to span keyboard 10. A brief description regarding the general operation and techniques used in acoustic keyboards, such as keyboard 10, is given below for a better understanding of the development of the present acoustic transport member 12. A more complete description concerning acoustic keyboard systems is found in the aforementioned prior applications I and II and copending application III.

Acoustic keyboards—like other kinds of keyboards—include a plurality of depressible keys 14 for selectable actuation by the operator. A plurality of flexible strikers 16 are individually operable—in a flicking motion—by a related one of the keys 14 for delivering an impact blow to the member 12. The blow is sufficient for inducing sound waves sent forth from selected impact positions located along the member 12.

In the acoustic keyboard 10, the member 12 is used to transport the sound waves in diverging directions from their point of impact towards opposite ends 18 and 20. Identical transducers 22R and 22L (R and L denotes right and left) are operatively attached on ends 18 and 20 of member 12 respectively, for sensing and converting sound waves into corresponding electrical signals sent along lines 24 and 26.

Figure 2:
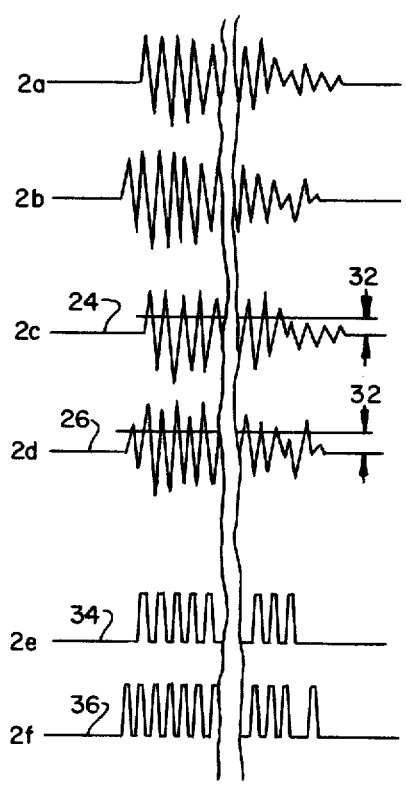
FIG. 2a–2f present individual illustrations of various signals generated by the components of FIG. 1.

FIGS. 2a and 2b generally illustrate the characteristic nature of sound waves as they propagate through the member 12. Each sound wave 2a and 2b, when viewed over its duration, is generally by nature a complex composite of multiple cycles whose intensity will taper off as energy is dissipated within member 12. The wave illustrated in FIGS. 2c and 2d shows wave characteristics of voltage signals emitted by transducers 22R and 22L in response to receiving sound signals 2a, 2b. Voltage signals 2c and 2d are then sent along connected output lines 24 and 26 (FIG. 1), respectively. If the sound waves 2a and 2b are compared to the corresponding voltage signals 2c and 2d, similarities will be noted with respect to frequency and amplitude of the compared signals. Thus the intensity of the received sound wave signals 2a and 2b are substantially equal to the voltage output signals 2c, 2d.

In FIG. 1, first and second signal conditioning circuitry, illustrated by boxes 28, 30 are connected to receive the voltage signals 2c and 2d appearing on lines 24, 26. In general, the conditioning circuitry boxes 28 and 30 include a comparator (not shown) provided with a reference voltage and an RC type circuit input used to establish a predeterminable electronic sensing threshold level 32 in FIG. 2c, 2d as will be seen. The primary purpose of the signal conditioning circuitry boxes 28 and 30 is to modify the incoming signals 2c, 2d into a series of constant amplitude logic pulses appearing on connected output lines 34, 36. FIGS. 2e and 2f illustrate the form of the modified signals on lines 34, 36 which are now compatible for use to operate ensuing logic circuitry contained within a logic block 38. Another purpose of the conditioning circuitry devices 28, 30 is to set the electronic sensing threshold 32, shown in FIGS. 2c and 2d. This constant level peak cut off pre-establishes a minimum acceptable voltage amplitude and thereby filters out weak voltage excursions. Signals received on lines 24 and 26 below the sensing threshold 32 are thus eliminated as shown by the subsequent absence of an output pulse (FIGS. 2e, 2f) on lines 34 and 36. The connected logic block 38 comprises a network of inter-connected electrical components including a time-measuring counter (not shown). Logic block 38 begins operation for measuring elapsed time between the initial pulse of signals 2e, 2f upon receipt of the first arriving signal along either of lines 34, 36. The time interval is used to establish a code representative of the selected striker 16 which, in turn, is used to control machine functioning, accordingly. A suitable operative logic block 38, as well as aforementioned conditioning circuitry 28 and 30, are fully described in prior copending applications I and III.

The above description refers in general to known acoustic systems employing the acoustic keyboard 10 and used preferably in connection with controlling the multiple functions of a typewriter. Specifics of the present invention will now be described and its advantages can be fully appreciated in view of the overall techniques disclosed in connection with acoustic keyboard 10.

Referring now to FIG. 3, there is shown a known acoustic transport member 12A i.e., the one disclosed in prior application II. The member 12A has triangular tabs 40 defining impact positions for receiving an impact blow from a related striker 16 (not shown). An elongated sound corridor 44 integrally supports the tabs 40 and functions to transport sound waves induced by striker 16 actuation from the selected tab 40 towards ends 18 and 20 of the member 12A.

In using the acoustic type keyboard 10 equipped with known acoustic transport member 12A, the acoustic system is found to be sensitive to factors which will vary the accuracy of the encoding process, particularly those variables which will effect the velocity and amplitude of the acoustic waves as they travel within member 12A. Variation in acoustic systems are a result of change in temperature, material property, acoustic dispersion (i.e., changes in transducer signal rise time with distance from the strike point), electronic threshold drift, reference frequency drift, shifting impact point, wear at the impact point and timer resolution.

Though the acoustic system disclosed in prior application II is a significant improvement over the prior art, one area found in need of improvement is in reducing the effects known as wave dispersion discovered occuring within the tabbed member 12A. Wave dispersion is a scattering of the wave from its natural form and serves to accelerate the energy dissipating process which weakens the intensity of the waves when sensed by transducers 22R, 22L. Dispersion is attributed to sound waves contacting and reflecting off peripheral boundary surfaces defining member 12A, and particularly surfaces 46 and 48 of tabs 40 which are discontinuously orientated with respect to the intended plane of wave transport provided by corridor 44. The acoustic system employing tabbed member 12A is operable. However, discontinuous surfaces 46, 48 have enhanced, over previously straight acoustic transport members, dispersion by allowing the propagating sound wave to enter areas of the tabs 40.

The present perforated acoustic transport member 12, in FIGS. 4 and 5, is constructed to minimize the amount of wave dispersion by initially directing the sound waves in the intended plane of movement and thereafter substantially isolating them from contact with discontinuous surfaces 46, 48. According to the present invention, the perforated acoustic transport member 12 is an elongated bar fabricated with triangular tabs 40 integrally formed with transport corridor 44. Extending through each equilateral triangular tab 40 there is provided an aperture 42. A preferably circular shaped rim 50 defines aperture 42 which is centrally located on tab 40 tangent with a base line 52 of corridor 44. Thus, a pair of solid passageways 54 and 56 are defined between the rim 50 and the discontinuous side edges 46, 48 of the tabs 40. The passageways 54, 56 angularly extend toward the horizontal plane established by the corridor 44. An impact tip 58 is formed where the converging side edges 46, 48 are joined. The tips 58 of tabs 40 are spaced along the member 12 according to the horizontal spacing of the strikers 16. There being provided at least one tip 58 for receiving an impact blow from one related striker 16. Preferably, acoustic transport member 12 is fabricated from a metal material having the capability of propagating sound waves at a predeterminable, substantially constant velocity within itself upon impact e.g., by striker 16.

The ends 18 and 20 operatively supporting transducers 22R and 22L are horizontal extensions of corridor 44. In this manner, corridor 44 spans all of the tabs 40 enabling the transducers 22R and 22L to receive sound waves induced by actuation of any striker 16.

In operation, key 14 actuation of its related striker 16 causes it to deliver an impact blow on the tip 54 of the selected tab 40. The impact is sufficient to give rise to sound waves that undulate away from the tip 58. The sound waves contact rim 50 which forces them to split and pass through passageways 56, 58 in communicating the sound waves from the tab 40 into corridor 44. Thus, the sound waves are directed or aimed towards end 18 and 20 of member 12. This is an important feature provided by the present perforated acoustic transport member 12 over known tabbed member 12, since a great deal of wave dispersion within known member 12A is believed to occur as a result of the sound waves orientating themselves toward ends 18, 20.

Once inside the corridor 44, the sound waves propagate in opposite directions toward transducers 22R and 22L. A front surface 60, rear surface 62 and a top surface 64 of corridor 44 provide continuous boundary edges for the propagating sound wave to reflect off during their transit through the corridor 44.

Sound waves, illustrated in FIGS. 2a and 2b, are continually being reflected off continuous boundary surfaces 60, 62, 64, yet always moving in the general horizontal plane in corridor 44 towards ends 18 and 20. With each reflection of the wave, its amplitude is slightly diminished or weakend due in part to dispersion or scattering of the wave from its natural form. The degree or amount of dispersion depends primarily upon the angle of reflection presented by boundary surfaces 60, 62, 64 relative to the horizontal direction of the corridor 44 transporting the propagating sound waves. For example, in using known member 12A, wave excursions enter into contact with and bounce off angular edges 46 and 48 of tabs 40, which are discontinuously orientated with respect to the horizontal plane of corridor 44. This serves to aggravate dispersion of the traveling sound waves. Of course, some degree of dispersion occurs as a result of the waves being reflected off continuous surfaces 60, 62, 64 of corridor 44, but at a significantly lesser extent, compared to surfaces 46, 48.

The significance of the effects caused by wave dispersion in e.g., acoustic transport member 12A is realized in the kind of corresponding output voltage signals emitted from transducers 22R and 22L onto lines 24 and 26, respectively. Transducers 22R and 22L are only capable of sending forth voltage excursions comparable in form to those of sound waves received. Accordingly, a weak acoustic signal input produces a correspondingly weak voltage signal output. As previously stated, the voltage signal conditioning boxes 28 and 30 operate to eliminate voltage inputs received below the setting of the sensing threshold level 32. Under conditions wherein wave dispersion remains unchecked, weak sound signals received by transducers 22R and 22L in the acoustic system often produce voltage signals below the sensing threshold level 32.

Another important concept concerning the present invention resides in the presence of rim 50 and particularly a top segment 66 thereof positioned tangent with base line 52 of corridor 44. This arrangement provides a substantially continuous series of boundary surfaces 66 exposed to corridor 44 for reflecting sound waves in the vicinity of tabs 40. As a result a substantial portion of the sound waves are prevented or isolated from coming into contact with discontinuous surfaces 46, 48. As sound waves 2a and 2b propagate through the corridor 44, they contact and reflect off the flat continuous boundary surfaces 60, 62, 64. During the downward motion of each wave excursion, a major portion of the wave contacts and bounces off top segment 66. Obviously, some portion of the propagating sound waves will enter the area of the tabs 40 through passageways 56, 58. This "reverse communication" is expected to occur, yet unexpectedly has been found to have little effect on the over-all improvement provided by aperture 42 in sustaining the amplitude of the waves, as discussed below.

As previously mentioned, the traveling sound waves are always moving in the general horizontal direction towards ends 18, 20. With each reflection of the wave, its amplitude is somewhat diminished or weakened due to energy dissipating caused by dispersion or scattering of the waves excursions from its natural form. The degree or amount of dispersion depends upon the angle of wave reflection with respect to the general horizontal direction of wave movement. Thus, by providing substantially horizontal surfaces 60, 62, 64, 66, that substantially trap the waves within corridor 44, the present perforated acoustic transport member 12 minimizes wave dispersion.

FIG. 6 is a graphic illustration generally showing a measure of improvement in minimizing wave dispersion for retaining the intensity of sound waves propagating through the perforated acoustic transport member 12 compared to known member 12A. In the graph, the solid line 68 depicts a wave form produced from passing through the known acoustic member 12A (disclosed in prior application II). The dashed line 70 represents a wave form obtained using the perforated acoustic member 12 as will be explained below.

The configuration of the two acoustic members 12, 12A, are identical except for the aperture 42 feature. Also, the impact point selected for producing the wave forms 68, 70 shown and its distance to the transducers 22R and 22L is the same. Since only a comparitive examination of FIG. 6 is necessary to appreciate the improved quality of corresponding wave signals and for clarity sake, references relating to specific data values have been omitted.

On the graph of FIG. 6 a horizontal axis 72 depicts time (t) and a vertical axis 74 is used as a measure of the height or amplitude (a) of the waves which signifies a measure of its intensity and can be expressed in terms of e.g., voltage levels appearing on lines 24, 26. Also shown on the graph is a horizontal line 76 used to represent an amplitude level corresponding to the pre-set threshold sensing level 32 set in signal conditioning boxes 28, 30. The purpose of illustrating line 76 is to provide on the graph an indicator as a measure of improvement in rise time for a specific amplitude (gain in slope) of corresponding waves transported through the two compared members 12, 12A.

In FIG. 6, the solid wave line 68 of tabbed acoustic member 12A serves as a basis for comparing the other wave line 70 of stepped member 12. In contrast, wave line 70 shows superiority in terms of amplitude attained and shortness of rise time in crossing threshold line 76. The rise time or delay for each wave 68, 70 is denoted by lengths d, d'. The significance of the delay times d, d', is that they are primarily the result of wave dispersion dissipating energy within the two acoustic members 12, 12A. In other words, dispersion has a direct effect on the rise time of a particular wave. Accordingly, increases in the amount of dispersion causes increases or time delay in wave rise time which ultimately will effect the accuracy of the acoustic system. Therefore, the delay lengths d, d' represent a measure of wave dispersion occuring within each of the members 12, 12A. As evidence from examination of FIG. 6, the perforated member 12, producing wave 70 shows a significant improvement in reducing the delay period d' compared to length d of wave 68 produced by member 12A.

Also, there is an improvement in the increased amplitude attained by wave 70 over that of wave 68.

Other attempts to reduce wave dispersion were tried, these included varying the angular degree of discontinuous surfaces 46 and 48 with respect to the horizontal base line 52 and changing the height of tabs 40 (different distances between tip 52 and base line 52) on the acoustic member 12A. Some of these configurations worked better than others, but none produced the overwhelming improvements in wave quality as accomplished by adding the aperture 42 feature.

While the foregoing description has disclosed a circular-shaped aperture 42 as successfully minimizing dispersion of sound waves traveling within a toothed acoustic transport member, it will be clear to those skilled in the art that the important aspect of applicant's disclosure resides in providing sound wave reflecting boundaries for the purpose of substantially isolating the propagating sound waves from coming into contact with discontinuous surfaces of the tabs 40. Accordingly, other aperture shapes such as a triangle would be equally applicable. Other modifications of this nature will be evident to those skilled in the art and these too are intended to fall within the scope of the present concept. The presently disclosed embodiment is therefore to be considered in all respects as illustrative and not restrictive, the scope of the invention being defined by the appended claims rather than by the foregoing description, and all changes which come within the meaning and range of equivalency of the claims are therefore intended to be embraced therein.

I claim:

1. An improved acoustic transport member for use in a keyboard, the member serving to transport acoustic energy in the form of propagating sound waves, the keyboard having a plurality of keys means and a plurality of key-actuated strikers, each one of the key means operable to actuate selectably a related one of the strikers, the member receiving a sound-inducing impact in response to actuation of the selected striker, and the induced sound waves which propagate through the member being subject to dispersion of the waves an amount determined by contactable surfaces of the member and their orientation relationship relative to an intended plane of movement for the propagating sound waves provided by the member, the improved acoustic transport member comprising:

a one-piece construction member;
   a first portion of the member providing a plurality of non-vibrating impact positions aligned with a related striker for receipt of the sound-inducing impact;
   a second portion of the member continuously joined to each one of said plurality of impact positions to permit free passage of sound waves from said first portion to said second portion, said second portion having sound wave reflecting boundaries defining a continuous corridor for establishing an uninterrupted path of movement for the received sound waves to propagate therethrough; and structure means on said impact positions of said first portion, said structure means defining a plurality of sound passages in each first portion for directing the sound waves in different directions within said impact positions towards said path of movement in communicating the sound waves from said first portion into said second portion, and said structure means defining a sound reflecting surface exposed to said second portion and located along said path of movement of the propagating sound waves for reflecting sound waves traveling through said second portion in substantial isolation to prevent the sound waves from entering areas of said impact positions of said first portion other than the impact position aligned with the selected striker thereby minimizing dispersion of the propagating sound waves in said second portion.

2. An acoustic transport member according to claim 1, wherein said impact positions of said first portion are projections extending from said second portion and said structure means defining said plurality of sound passages and said sound reflecting surface comprise a peripheral rim formed by an aperture extending through said projection.

3. An acoustic transport member according to claim 2, wherein said projections are triangular tabs and said aperture is centrally located on said tabs.

4. An acoustic transport member according to claim 3, wherein said aperture is a circular opening.

* * * * *